United States Patent [19]

McMahon

[11] Patent Number: 5,734,555
[45] Date of Patent: Mar. 31, 1998

[54] SHARED SOCKET MULTI-CHIP MODULE AND/OR PIGGYBACK PIN GRID ARRAY PACKAGE

[75] Inventor: John Francis McMahon, Phoenix, Ariz.

[73] Assignee: Intel Corporation, Santa Clara, Calif.

[21] Appl. No.: 220,813

[22] Filed: Mar. 30, 1994

[51] Int. Cl.[6] ........................................ H05K 7/20
[52] U.S. Cl. ........................ 361/704; 257/686; 257/697; 257/713; 361/715; 361/719
[58] Field of Search ........................ 174/52.1, 52.2; 324/755; 257/697, 686, 706, 713; 361/704, 707, 709–710, 715–722, 735, 744, 761, 763–764, 766, 782–785, 790–792; 439/70, 485

[56] References Cited

U.S. PATENT DOCUMENTS

| | | | |
|---|---|---|---|
| 3,403,300 | 9/1968 | Horowitz et al. | 361/735 |
| 4,514,784 | 4/1985 | Williams et al. | 361/791 |
| 4,729,061 | 3/1988 | Brown | 361/792 |
| 5,016,138 | 5/1991 | Woodman | 361/744 |
| 5,036,431 | 7/1991 | Adachi et al. | 361/792 |

*Primary Examiner*—Gregory D. Thompson
*Attorney, Agent, or Firm*—Blakely, Sokoloff, Taylor & Zafman

[57] ABSTRACT

An electronic package for an integrated circuit (IC). The package has a plurality of first pins extending from a laminated plastic/printed circuit board substrate. The pins are coupled to the integrated circuit and provide a means for mounting the package to an external printed circuit board. The package also has an internal circuit board that is coupled to both the substrate and the IC by a plurality of second pins. Mounted to the circuit board are passive and/or active electrical elements that are connected to the integrated circuit through the second pins. Some of the second pins may extend entirely through the substrate to directly couple the internal circuit board and electrical elements to the external printed circuit board. To improve the thermal impedance of the package, the integrated circuit is mounted to a heat slug which can be attached to a heat sink. The heat sink may also provide a substrate for the internal circuit board.

11 Claims, 4 Drawing Sheets

SHARED SOCKET MULTI-CHIP MODULE AND/OR PIGGYBACK PIN GRID ARRAY PACKAGE

BACKGROUND OF THE INVENTION

1. Field of the Invention

The present invention relates to an electronic package for an integrated circuit.

2. Description of Related Art

Integrated circuits are typically housed within a package that can be mounted to a printed circuit board. One conventional type of IC package is a printed circuit board based housing which has a plurality of external pins, commonly referred to as a plastic pin grid array (PPGA) package. IC packages can also be constructed from a ceramic material that is co-fired and sealed with a lid. Although both types of packages are widely used, PPGA packages are popular because they are relatively inexpensive to produce.

IC packages are used to house high frequency semiconductive devices such as a microprocessor. High frequency devices are particularly sensitive to electrical noise on the power and the data signals transmitted between the package and the printed circuit board. Electrical noise can be reduced by soldering passive elements, such as a capacitor(s), to the printed circuit board. Attaching passive elements to the circuit board occupies valuable board space and increases circuit inductance.

Voltage regulators and power converters are typically coupled to an integrated circuit to control the power delivered to the circuit. To reduce the inductance length between the devices, it is desirable to place the voltage regulator/power converter into close physical proximity with the integrated circuit. Long trace lengths may increase the inductance and noise between devices.

Integrated circuits can contain millions of transistors which draw a significant amount of current, thus generating a relatively large amount of heat within the device. The heat must be removed from both the IC and the package. The thermal impedance of the package must be low enough to insure that the junction temperatures of the integrated circuit are maintained within safe operating limits. Thermally conductive heat slugs are sometimes incorporated into the package to improve the thermal efficiency in removing heat from the integrated circuit. It is therefore desirable to provide a relatively low cost PPGA package assembly that contains a heat slug, and both passive and active elements.

SUMMARY OF THE INVENTION

The present invention is an electronic package for housing an integrated circuit (IC). The package has a plurality of first pins extending from a plastic element. The pins are coupled to the integrated circuit and provide a means for mounting the package to an external printed circuit board. The package also has an internal circuit board that is coupled to both the plastic element and the IC by a plurality of second pins. Mounted to the circuit board are passive and/or active electrical elements that are connected to the integrated circuit through the second pins. Some of the second pins may extend entirely through the internal circuit board to directly couple the electrical elements to the external printed circuit board. To improve the thermal impedance of the package, the integrated circuit is mounted to a heat slug which can be attached to a heat sink. The heat sink may also provide a substrate for the internal circuit board.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
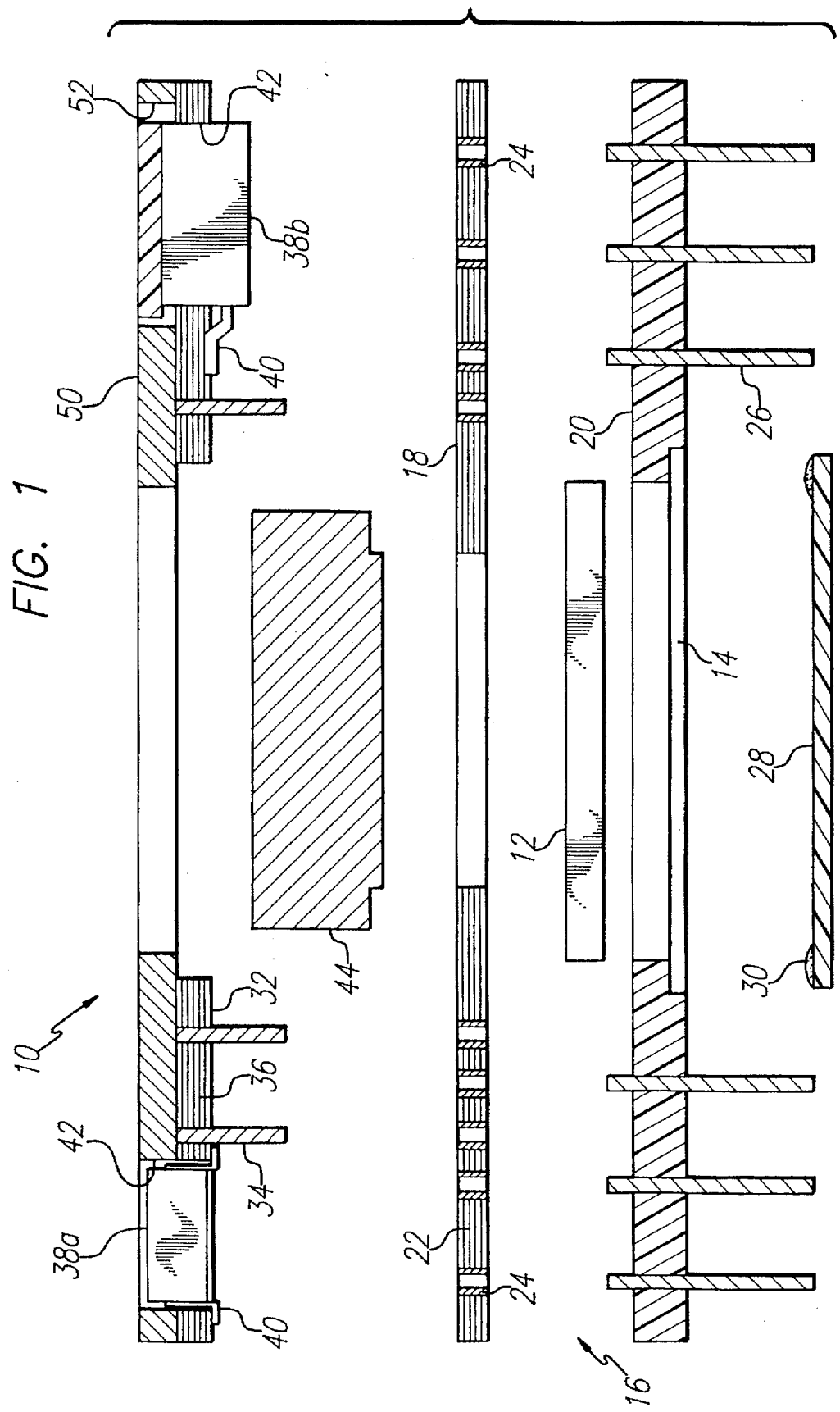
FIG. 1 is an exploded view of an electronic package of the present invention.
Figure 2:
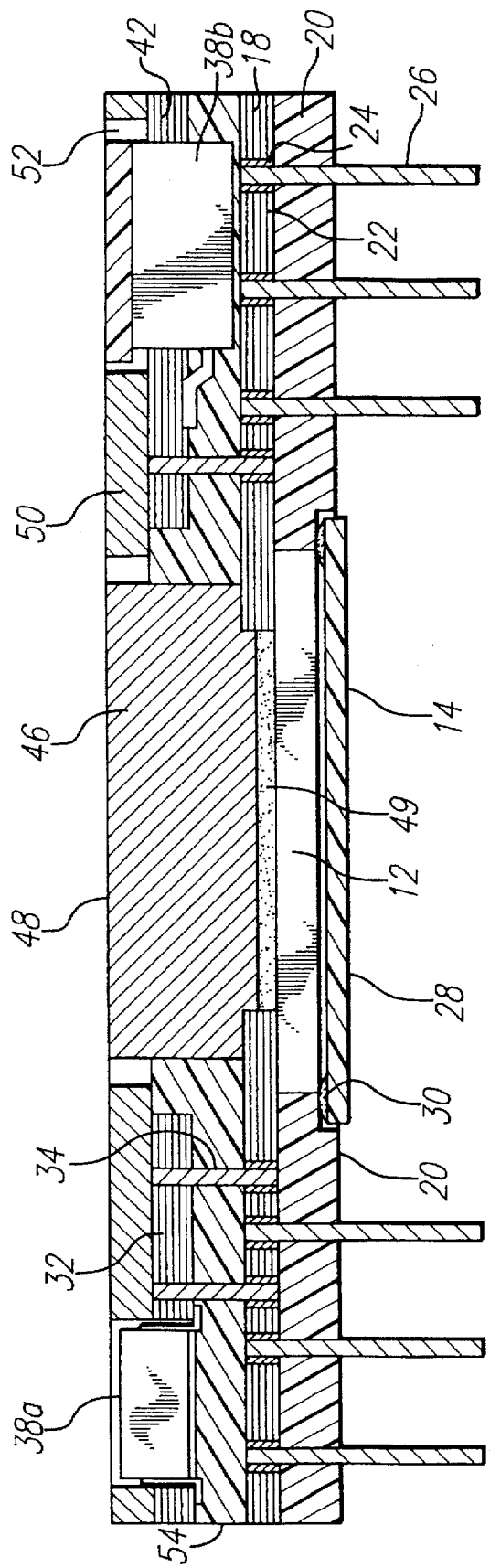
FIG. 2 is a cross-sectional view of an assembled electronic package of FIG. 1.

Referring to the drawings more particularly by reference numbers, FIGS. 1 and 2 show an electronic package 10 of the present invention. The package 10 contains an integrated circuit 12. The integrated circuit 12 may be any type of semiconductive device, including but not limited to a microprocessor. The integrated circuit 12 is located within the inner cavity 14 of a plastic element 20. The plastic element 20 is attached to a first printed circuit board 18. The printed circuit board 18 may contain a plurality of conductive layers 22 and plated through holes 24. The integrated circuit 12 is typically coupled to the conductive layers 22 of the printed circuit board 18 by surface pads (not shown) located on both the circuit board 18 and the integrated circuit 12.

Attached to the plated through holes 24 are a plurality of first pins 26. The first pins 26 extend through the plastic element 20 and provide a means to mount the package 10 to an external printed circuit board (not shown). The pins 26 are coupled to the integrated circuit 12 by plated through holes 24 and conductive layers 22 of the printed circuit board 18. The integrated circuit 12 is enclosed within the inner cavity 14 by a lid 28. The lid 28 is typically bonded to the plastic body by an adhesive 30.

The package 10 further includes a second circuit board 32 which has a plurality of second pins 34 that couple the second board 32 with the first board 18. The ends of the second pins 34 are attached to the plated through holes 24 of the first board 18, and are coupled to conductive layers 36 within the second circuit board 32. Although rigged printed circuit boards are described, it is to be understood that the boards 18 and 32 can be constructed from a flexible polyimide material to create a flexible circuit board.

Mounted to the second circuit board 32 are a number of electronic devices 38a and 38b. The devices 38a and 38b are connected to the conductive layers 36 of the second circuit board 32 by leads 40. The electronic devices 38a and 38b are coupled to the integrated circuit 12 and the first pins 26 by the second pins 34 and the circuit board 32. The electronic devices 38a and 38b may be either passive or active elements. For example, device 38a may be a decoupling capacitor used to control the impedance of the package and the integrated circuit. The capacitor may have a relatively high capacitance to reduce the amount of noise on the signals transmitted between the integrated circuit 12 and the external printed circuit board. Device 38b may be a voltage regulator or a power converter that controls the power delivered to the integrated circuit 12. The devices 38a and 38b may be located within slots 42 of the circuit board 32 to reduce the profile of the package 10. The electronic devices may be housed within an outer casing.

To improve the thermal efficiency of the package 10, a heat slug 46 is attached to the first circuit board 18. The heat slug 46 is preferably constructed from a thermally conductive material such as copper and has an exposed outer surface 48 that allows the heat generated by the integrated circuit 12 to be removed from the package 10. In the preferred embodiment, an electrically or thermally conductive epoxy or adhesive 49 is placed between the integrated circuit 12 and the heat slug 46 to reduce the resistance of the thermal path between the circuit 12 and the slug 46. The second circuit board 32 may also be mounted to a heat spreader 50 that provides a hard outer surface for the package and a thermal path for the heat generated by the electronic devices 38a and 38b. The heat spreader 50 may have slots 52 which allow the devices 38a and 38b to be removed from the package 10. A plastic encapsulant 54 is injected into the space between the first 18 and second 32 circuit boards to protect the devices 38a and 38b and add structural integrity to the package 10.

To assemble the package 10, the integrated circuit 12 is mounted to the first circuit board 18 and the first pins 26 are attached to the plated through holes 24. The pins 12 are pre-assembled into the plastic element 20, which is coupled to the board 18. The lid 28 can be attached to the substrate 16 to partially enclose the integrated circuit 12.

The devices 38a and 38b and second pins 34 are attached to the second circuit board 32 which is bonded to the heat sink 50. The first circuit board subassembly and the second circuit board subassembly can be tested to detect any defects in either the devices 38a and 38b, circuit 12 or the subassemblies. After testing, the second pins 34 are attached to the first circuit board 18. The heat slug 46 is then mounted to the first circuit board 18 and the integrated circuit 12. After assembly of the heat slug 46, the encapsulant 54 is injected into the space between the circuit boards 18 and 32.

Figure 3:
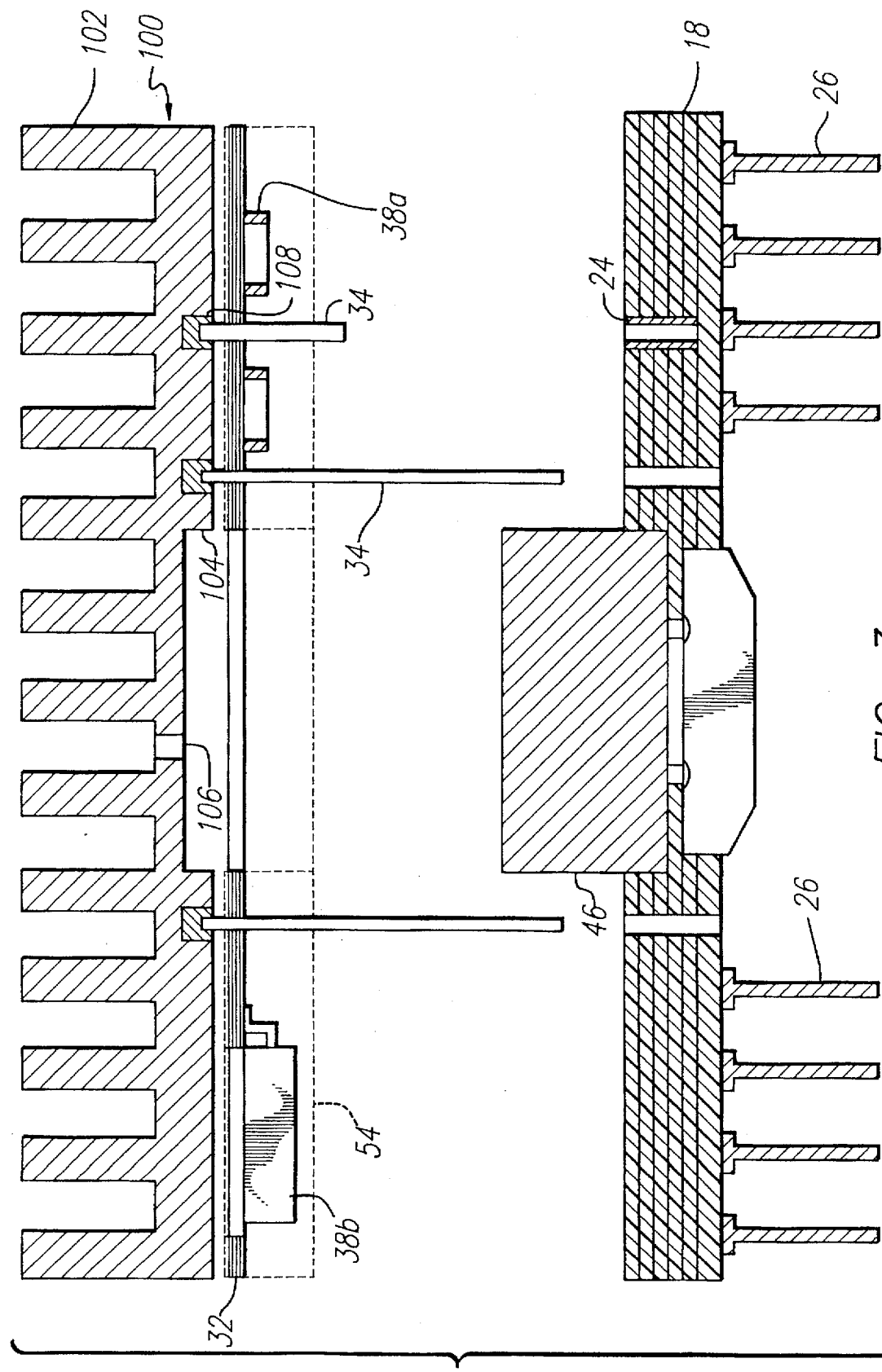
FIG. 3 is an exploded view of an alternative embodiment of the electronic package.
Figure 4:
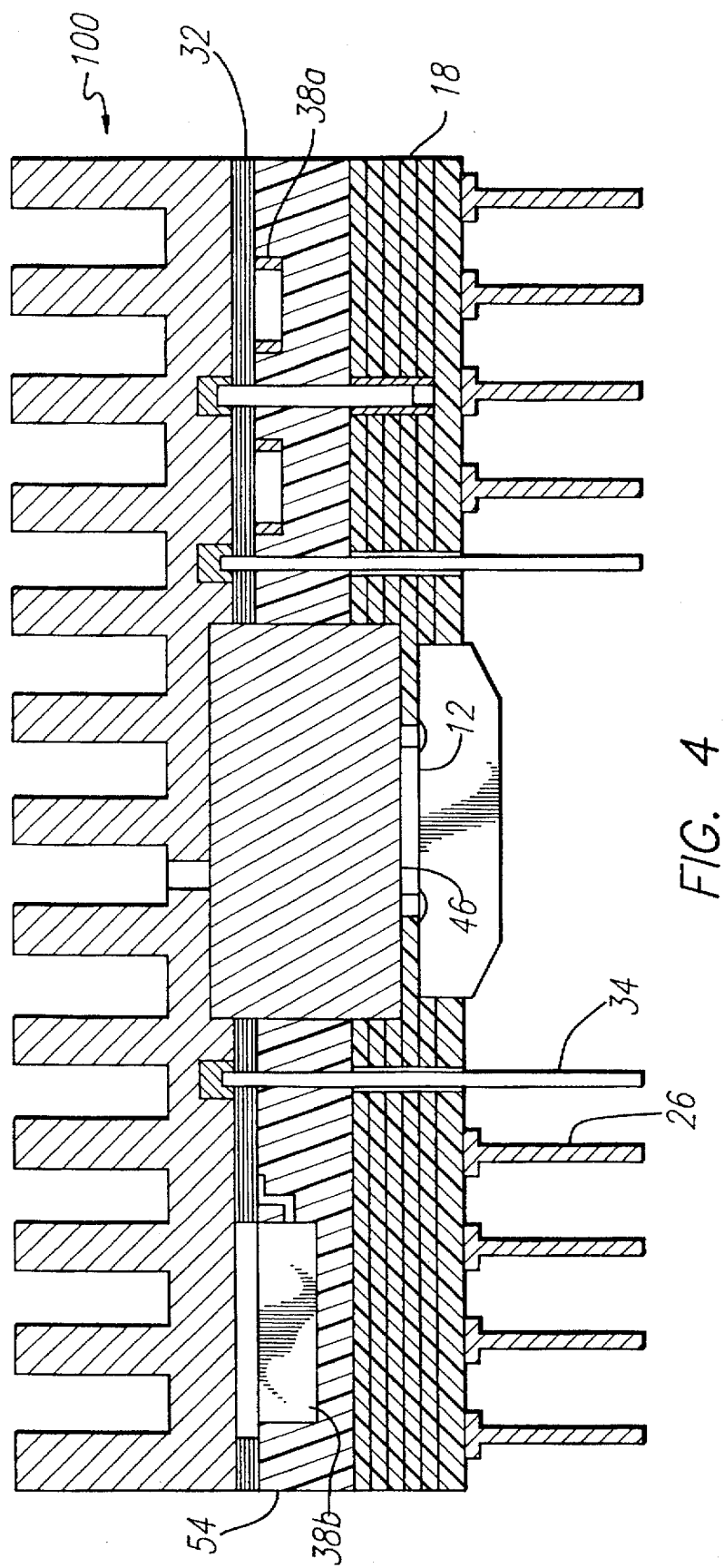
FIG. 4 is a cross-sectional view of an assembled electronic package of FIG. 3.

FIGS. 3 and 4 show an alternate embodiment of the package. The heat sink 100 may have fins 102 and a slot 104 that receives the heat slug 46. The base of the heat sink 100 may have a through hole 106 that allows adhesive to be applied to the top surface of the slug 46. The heat sink 100 may also have slots 108 that capture the ends of the second pins 32. The second pins 34 may extend through the substrate 110 to directly couple the second circuit board 32 and devices 38a and 38b to the external printed circuit board. The second pins 34 that extend through the substrate 110 may couple the devices 38a and 38b to the external circuit board without reducing the number of first pins 26 dedicated to the integrated circuit 12. If the devices 38a and 38b include a power control device such as a voltage regulator or a power converter, the second pins 34 that extend through the substrate 16 may be dedicated to power and ground. Although encapsulant 54 has been described as being injected after the second pins 34 are connected to the first circuit board 18, it is to be understood that the plastic molding may be formed before the second pins 34 are connected to the board 18.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package, comprising:

a first circuit board;

a plurality of first pins that terminate at and extend from said first circuit board;

an integrated circuit coupled to said first pins;

a second circuit board that has a slot;

a heat slug that is located within said slot of said second circuit board and is coupled to said integrated circuit;

at least one electrical element mounted to said second circuit board; and, a plurality of second pins coupled to said electrical element, said second pins terminate at said second circuit board and extend into said first circuit board.

2. The electronic package as recited in claim 1, wherein at least one second pin extends through said first circuit board.

3. The electronic package as recited in claim 1, further comprising a heat sink attached to said heat slug and said second circuit board.

4. The electronic package as recited in claim 1, further comprising a plastic element that captures said first pins.

5. The electronic package as recited in claim 3, wherein said heat slug is located within a slot of said heat sink.

6. The electronic package as recited in claim 1, wherein said second circuit board is mounted to a heat sink.

7. The electronic package as recited in claim 1, further comprising an encapsulant between said first and second circuit boards.

8. The electronic package as recited in claim 1, wherein said electrical element is passive.

9. The electronic package as recited in claim 1, wherein said electrical element is a voltage regulator.

10. The electronic package as recited in claim 1, wherein said electrical element is a power converter.

11. The electronic package as recited in claim 4, further comprising a lid that is mounted to said plastic element and which encloses said integrated circuit.

* * * * *